(12) United States Patent
Warren et al.

(10) Patent No.: US 6,304,666 B1
(45) Date of Patent: Oct. 16, 2001

(54) APPARATUS FOR SENSING PATTERNS OF ELECTRICAL FIELD VARIATIONS ACROSS A SURFACE

(75) Inventors: William L. Warren, Arlington, VA (US); Roderick A. B. Devine, Paris (FR)

(73) Assignee: The United States of America as represented by the United States Department of Energy, Washington, DC (US)

(*) Notice: Subject to any disclaimer, the term of this patent is extended or adjusted under 35 U.S.C. 154(b) by 0 days.

(21) Appl. No.: 09/167,772

(22) Filed: Oct. 7, 1998

(51) Int. Cl.[7] ........................................... G06K 9/28
(52) U.S. Cl. ........................ 382/124; 382/312; 382/108
(58) Field of Search .................................. 382/120–127, 382/108, 312, 313, 315; 356/71; 340/825.34, 5.53, 5.83; 257/298, 300, 304, 405, 410, 411, 903; 365/177, 178, 182; 438/151, 194, 201, 289, 294, 517

(56) References Cited

U.S. PATENT DOCUMENTS

| | | | | |
|---|---|---|---|---|
| 4,236,792 | | 12/1980 | Bissar | 359/269 |
| 4,429,413 | * | 1/1984 | Edwards | 382/4 |
| 4,839,700 | * | 6/1989 | Ramesham et al. | 357/2 |
| 5,270,711 | * | 12/1993 | Knapp | 341/34 |
| 5,830,575 | * | 11/1998 | Warren et al. | 428/404 |
| 5,862,247 | * | 1/1999 | Fisun et al. | 382/116 |
| 5,963,679 | * | 10/1999 | Setlak | 382/312 |
| 6,140,157 | | 10/2000 | Warren et al. | 483/149 |

FOREIGN PATENT DOCUMENTS

| | | | | |
|---|---|---|---|---|
| 925178A1 | 6/1999 | (EP) | | B32B/9/00 |
| WO9810925A1 | 3/1998 | (WO) | | B32B/9/00 |

* cited by examiner

*Primary Examiner*—Leo Boudreau
*Assistant Examiner*—Brian P. Werner
(74) *Attorney, Agent, or Firm*—James C. Durkis; Dickson G. Kehl; John T. Lucas

(57) ABSTRACT

An array of nonvolatile field effect transistors used to sense electric potential variations. The transistors owe their nonvolatility to the movement of protons within the oxide layer that occurs only in response to an externally applied electric potential between the gate on one side of the oxide and the source/drain on the other side. The position of the protons within the oxide layer either creates or destroys a conducting channel in the adjacent source/channel/drain layer below it, the current in the channel being measured as the state of the nonvolatile memory. The protons can also be moved by potentials created by other instrumentalities, such as charges on fingerprints or styluses above the gates, pressure on a piezoelectric layer above the gates, light shining upon a photoconductive layer above the gates. The invention allows sensing of fingerprints, handwriting, and optical images, which are converted into digitized images thereof in a nonvolatile format.

3 Claims, 3 Drawing Sheets

APPARATUS FOR SENSING PATTERNS OF ELECTRICAL FIELD VARIATIONS ACROSS A SURFACE

CROSS REFERENCE TO RELATED APPLICATIONS

This application is related to U.S. Ser. No. 08/714,547 now U.S. Pat. No. 5,830,575, for a "Memory Device Using Movement of Protons."

STATEMENT REGARDING FEDERALLY SPONSORED RESEARCH OR DEVELOPMENT

This invention was made with Government support under Contract DE-AC04-94AL85000 awarded by the U.S. Department of Energy. The Government has certain rights in the invention.

BACKGROUND OF THE INVENTION

There is a variety of applications in which it is useful to be able to provide a two-dimensional map of the distribution of charge or of potential across a surface. This map is normally in electronic form for use by a computer for processing of the information in the map or for storage in a memory medium of some sort.

Many of these applications involve the storing or processing of images such as writings, drawings, and photographs. etc. Typically, an optical image of the writing, drawing, picture, signature, etc. is transformed by a lens to fall onto an array of photodetectors which then provides an electronic description of the intensity of the light falling onto the individual elements of the photodetector array.

Other applications involve the creation of such images or other patterns via stylus input onto an electronic tablet or screen or via the sensing of fingerprints by means of a pressure-sensitive surface or directly by charge variations on the skin surface that correspond to the fingerprint. These images or patterns are not sensed optically but are, instead, sensed by charge or field inputs that are applied to selected areas of a sensing array. Such images and patterns may also be created by the measurement of thermal variations.

These applications are presently being met in the art by a variety of different devices, but most of them require significant amounts of power and are unable to store a sensed state without the further application of power to refresh their associated electronic memory storage units.

The methods currently used to perform these tasks may be costly in both time and material. For example, the recognition of an image usually requires some scanning system where the image is swept or scanned optically. The signal corresponding to pixels of the image detected by a photosensitive detector is then transformed into a digitized image. Certain applications that involve heavy use by the public, such as reading the finger print of a client at a point of sale for comparison to an electronic image of a finger print stored on a checking card ("smart card") will require devices that are rugged and inexpensive. Similar demands are set on all applications where one is required to install large numbers of such sensing and identification devices in circumstances such as those found involving charging the cost of a telephone call from a public phone via a smart card, identifying passengers in transit in air terminals, transactions at ATM machines, identification at security checkpoints and the like.

It would therefor be exceedingly useful if a sensing device existed that could perform these various applications and that had at least some of the following characteristics: simple and robust in construction, low power, low cost, readily portable as necessary and non-volatile. No such device is known at this time however.

BRIEF SUMMARY OF THE INVENTION

The above-referenced patent application, "Memory Device Using Movement of Protons," describes a new type of memory device in which the memory action is integrated into the gate oxide of the field effect transistor. In this device, charged particles (protons) are introduced into the gate oxide of the transistor by a sequence of thermal treatments. These charges can be swept up or down across the thickness of the oxide by the application of an appropriate potential to the gate electrode with respect to the substrate. This device is nonvolatile because, when the potential is removed, the mobile charges remain in their last position, thus maintaining the channel of the FET in either a conductive or non-conductive state after the potential has been removed. This nonvolatile On or Off state allows the FET to be used as a binary memory element.

The present invention recognizes that this nonvolatile FET (NVFET) can be used as a charge sensitive detector if the charge is placed on the gate of the NVFET. Rather than use the NVFET simply as a memory device, one can, with suitable modifications, use it to detect charge and to store its state electrically. Such a detector can be expressed as an array of NVFETs formed on a planar surface with each transistor addressed electrically to read it ON/OFF state. In other words, the charge established on the gate electrode of the NVFET will displace the mobile charges to a position such that they switch the transistor into the OFF or the ON state which is read as a source-drain current of the transistor which is either essentially zero (or very small) or substantially larger. The ON/OFF state of each individual transistor remains essentially "stored" in the device until a general potential is applied to the gates of all the NVFETs in the array, resetting all of the transistors into their basic mode. The particular implementation for applying a charge to the gates of the NVFET array can vary depending upon what needs to be sensed. The following paragraphs give summaries of several such embodiments of the invention.

One preferred embodiment of this invention is as a fingerprint detector. In the case of the operation of a normal MOSFET, one varies the potential applied to the gate electrode with respect to the source electrode by means of a voltage source and a conducting wire connected to the source and gate contacts. For applications such as the recognition of fingerprints, one can sense a ridge or a valley of a fingerprint by either placing a charge on the skin surface or by utilizing a piezoelectric polymer that will create a charge where the ridges in the fingerprints press down on the polymer. A thermoelectric or pyroelectric film may also be used. In any case, only the ridge will be sensed directly since only the ridge will contact a surface of the detector above the NVFET array. The charge from the ridges of the fingerprints will displace the mobile charges in the oxide layer of the NVFETs directly below the ridges and so switch the states of the individual, closely spaced transistors in the array. Once the states of those transistors touching the ridges of the fingerprints have been switched, the image of the fingerprint has been captured in a nonvolatile form and can then be read out electronically for further use or processing.

In another preferred embodiment, the invention may be employed to store handwriting. This application is similar to the fingerprint storage described above, but, instead of sensing the ridges of fingerprints, the point of a stylus is sensed. The point can be connected to a source of potential such that it is polarized either negatively or positively with respect to the source electrode of each NVFET in the array. Alternatively, the point is not charged but pushes down onto a piezoelectric layer that creates a potential between the contacted gate electrodes and the surface/sources of the affected transistors in the array. Only those transistors over whose gates the point will have passed will have had their electrical state modified so that when subsequently the electrical state of each transistor in the array is addressed, an electrical image of the written impression will be read. Such a recorded image may be transferred to a computer memory where it can be stored as information or used for purposes of comparison with an image already stored, i.e., a signature. The information written in the NVFET array can then be erased, and the array of transistors can be reset into its basic configuration by application of an erase potential simultaneously to the gates of all the transistors in the array. A subsequent writing and storage can then be commenced.

In yet another preferred embodiment, the invention may be employed as a scanner to digitize optical images. Scanners utilize arrays of photodetectors to convert the optical image into a digitized image. The photodiodes detect the light transmitted or reflected from a surface/object and convert the optical image into an electrical form which can be gray scale or binary. In the present embodiment, an array of charge sensitive NVFETs, that is capped by a photoconductive layer and a transparent electrode layer, can replace the photodiode array. More particularly, a layer of photoconductive material is deposited on the array of gates of the NVFETs, and this layer is covered with a film of electrically conductive/optically transparent material, such as indium tin oxide. A potential with respect to the array of source contacts of the NVFET array is applied to this film. The electrical bias is applied is such a way, using for example a potential divider, that in the absence of an image a small potential is applied between the gate and source electrodes. When the photoconductive film illuminated with light, a conducting path is established between the indium tin oxide (ITO) such that the full potential applied across the potential divider now appears between the gate electrode and the source contacts. The mobile charges in the oxide are then driven from one side of the gate to the other, thus modifying the on/off state of the NVFET. When the light source is removed and the photoconductive film becomes highly resistive again, the net potential applied between the gate and source electrodes is again small, too small to displace the mobile charges. The NVFETs in the array then remain in their on/off states induced during the illumination mode. To reset the system and place all of the transistors in the array in either the on or off mode, a suitable potential is applied between all of the gates and sources in parallel.

Because the NVFET is readily produced with more or less standard Si processing techniques, it may be readily appreciated that this invention describes an effect that can be realized in a variety of embodiments, each of which will offer important advantages over the present state of the art.

DETAILED DESCRIPTION OF THE INVENTION

The foundation for this invention is the NVFET. The theory, operation and fabrication of the NVFET are more completely described in U.S. Ser. No. 08/714,547, now U.S. Pat. No. 5,830,575, which is incorporated by reference herein in its entirety.

Figure 1A:
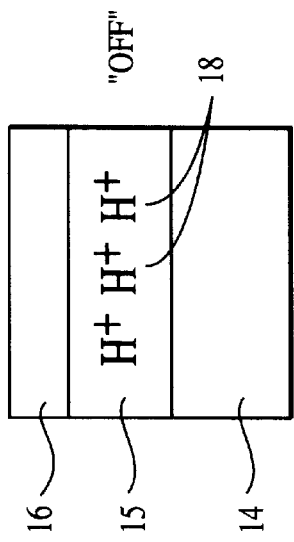
FIGS. 1A and 1B show how the movement of the protons in the oxide layer either destroys or creates the conducting channel in the p-Si below the adjacent oxide layer.
Figure 1B:
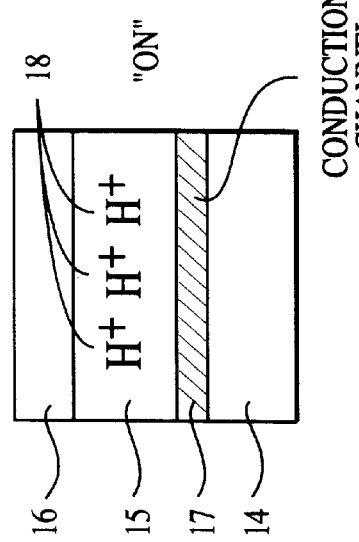
Figure 1:
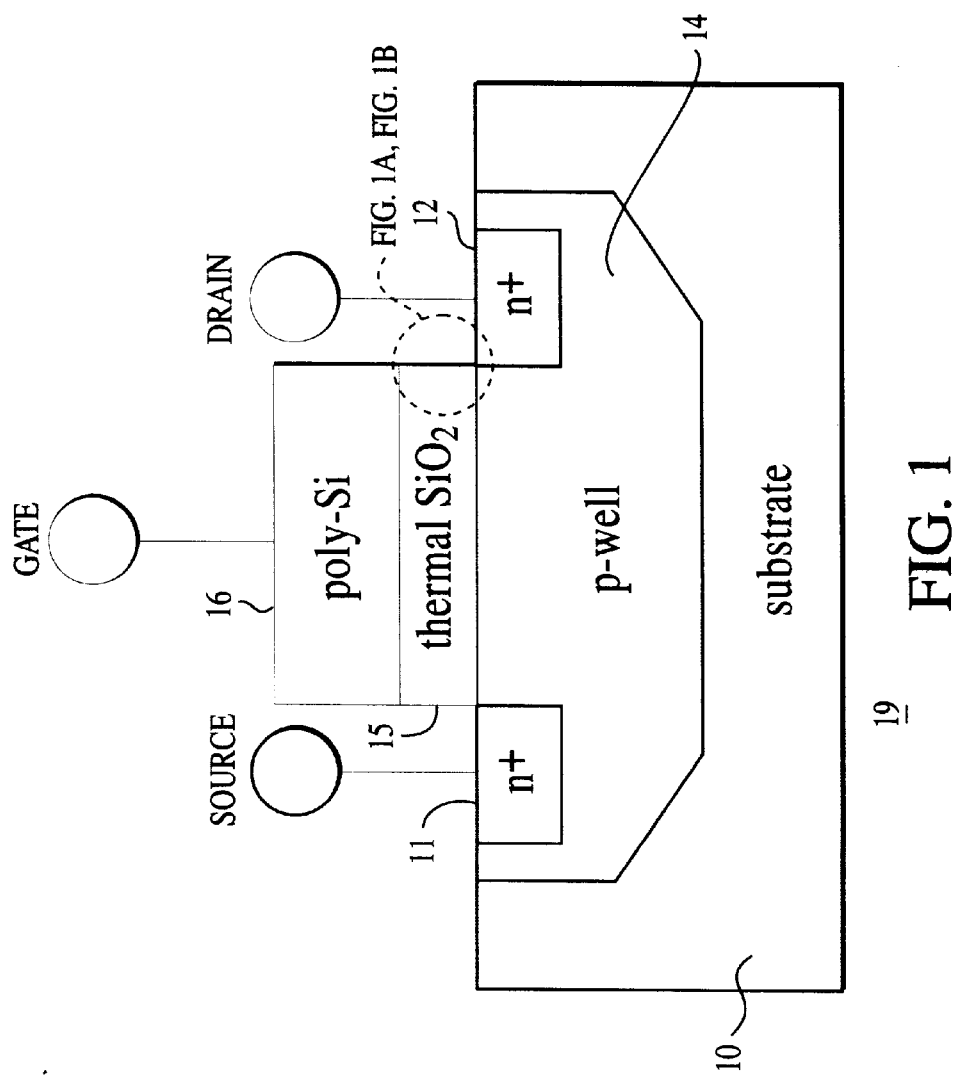
FIG. 1 is a schematic view of the basic structure and operation on an individual NVFET.

The basic construction and operation of an individual NVFET 19 is shown in FIG. 1. The device is formed on a Si substrate 10 in which a p-well 14 is formed by a conventional diffusion process followed by formation of the n+ source 11 and drain 12 regions within the p-well. A thermal oxide layer 15 is then grown, followed by deposition of the poly-Si gate electrode layer 16. After the poly-Si gate is formed but before metallization, the device is exposed to a hydrogen-containing gas (i.e. forming gas) in a high temperature anneal. This results in the creation of hydrogenous ions 18 (hereinafter, protons typically but also including deuterium and tritium ions also) within the oxide layer that remain trapped within the oxide layer after the device cools down from the anneal. Care should be taken to avoid further high temperature processing in order to avoid escape of the protons from the oxide layer.

The operation of the device is shown in FIGS. 1A and 1B. If the source is at a higher potential than the gate, the hydrogenous ions 18 will be pushed to the top of the oxide layer as shown in FIG. 1A. Since the protons 18 are now remote from the underlying channel region, they are too far away to attract any electrons within the p-well to the channel region immediately below the oxide layer. Without these electrons, there will be no conduction within the channel. For this reason, no conduction channel is shown in FIG. 1A. If the potential of the gate is higher than the source, the protons will be pushed down to the bottom of the oxide layer where they will act to attract mobile electrons into the channel region of the p-well to form the conduction channel region 17. Once the potentials on the gate/source are removed, the protons remain in their last position indefinitely. The positions of the protons in the array can be reset later, as desired.

Individual NVFETs, as depicted in FIG. 1, form the basis for the pixels in the arrays used in this invention. The differences between the various embodiments are found in the layers formed above the gates of the NVFETs and in the associated electronics that read and reset the transistors. Each pixel is buried/covered by an insulating layer that serves to isolate it from its neighboring pixels in the array and to protect the gate of the NVFET. To reset the pixels in the array, a common potential of sufficient strength to cause protons in the oxide layers of all the NVFETs to shift into the same position is applied between the gates and the sources (the drains and/or substrates could also be used alternatively).

Figure 2:
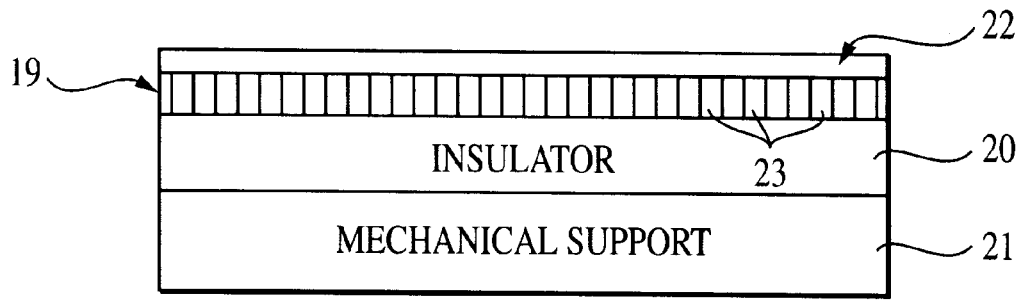
FIG. 2 is a cross sectional view of the basic embodiment of the invention, showing a portion of the array of NVFETs with their associated interconnections with an insulator and mechanical support below and a passivating and protecting insulator on the surface of the NVFET gates.

The simplified cross section view of FIG. 2 portrays one row 19 of pixels 23 covered by the protective insulating layer 22. This layer could be a piezopolymer. The pixels are formed upon an insulator layer 20, which in turn rests upon some sort of mechanical support 21. This is the simplest embodiment of the invention wherein the NVFETs in the pixels 23 respond directly to the potential created by charges on an object, such as a fingerprint, that is proximate to the insulating layer 22. When the array is in the sensing mode, the gates of the NVFETs in the pixels are left floating with respect to the source in order that the potential from the object can be sensed.

Figure 3:
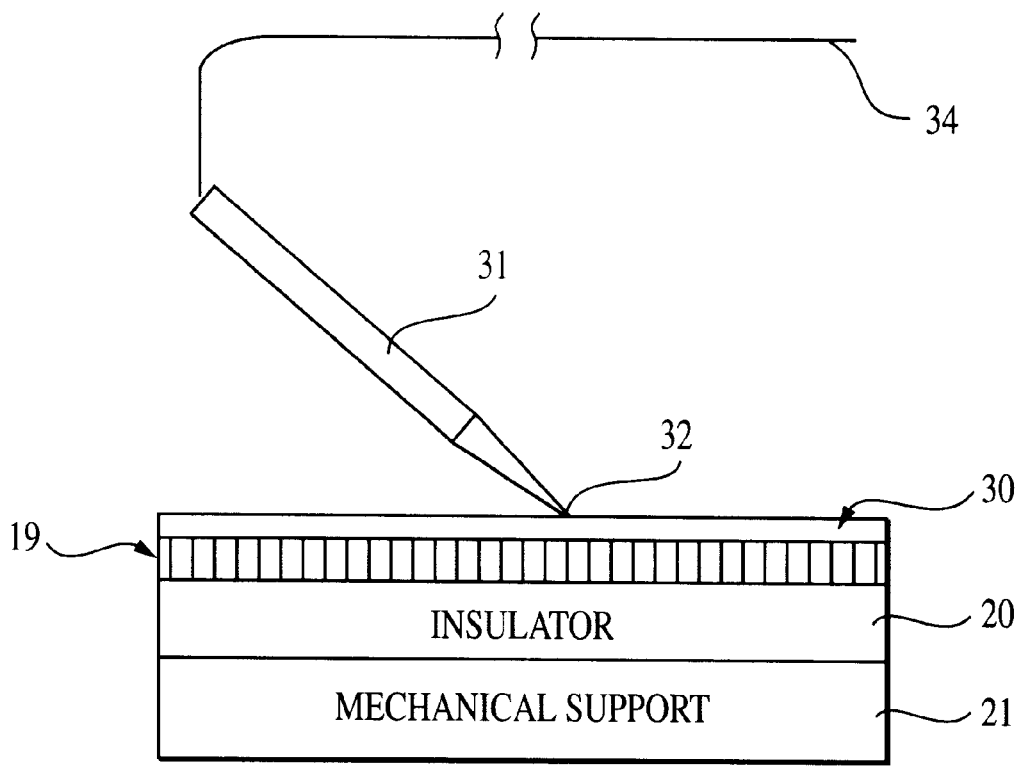
FIG. 3 is a cross sectional view of the fingerprint/ handwriting embodiment of the invention with a simple insulator layer on top of the second layer containing the gates of the transistors.
Figure 4:
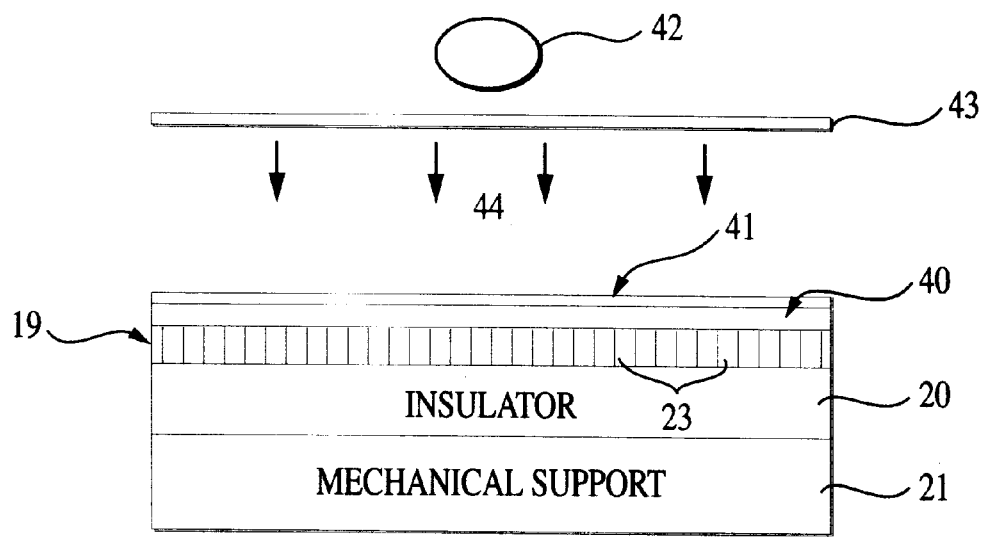
FIG. 4 is a cross sectional view of the scanner embodiment of the invention showing the projected optical image falling upon the ITO layer and the photoconductive layer above the NVFET array.

FIG. 3 shows the operation of another embodiment of the invention in which the potential is created between point 32 of a stylus 31 which is connected via a wire 34 to the sources (or drains/substrates) of all the NVFETs in the array. The positive or negative bias of the point 32 is sufficient to cause the protons to reposition themselves to a new state, compared to the reset state, when the point passes over the gates of certain of the transistors In the array. This write voltage will be in the range of about 2 volts, although it will depend on the thickness of the oxide layer. When the point of the stylus is removed the protons will remain in their current positions, and the individual pixels can be read as ON or OFF, depending upon the positions of the protons in the various NVFETs in the array.

In an alternative embodiment, the protective layer 30 may also include an upper piezoelectric layer that will create an electric field in response to pressure being applied to it. This potential can be of sufficient strength to change the position of the protons in certain of the pixels, thus writing the array. In this embodiment, the wire 34 of FIG. 3 is omitted, and the array is responsive directly to the pressure distribution across the array. The pressure can be created by a stylus point 32 or by other means, such as a fingerprint, in which the stylus may no longer be necessary.

In yet another preferred embodiment, the invention may operate as a scanner. Here, as with the preceding embodiments, the basic structure comprises the mechanical support 21 and the base insulating layer 20 with the array 19 of individual pixels 23 resting thereupon. The gates of the pixels are now covered with a photoconductive layer 40, instead of the protective insulating layer earlier described. Suitable materials include, but are not limited to, amorphous selenium and amorphous silicon. This photoconductive layer 40 is an insulator unless it is illuminated with the proper wavelengths of light, when it becomes conductive in the illuminated portions thereof. The photoconductive layer 40 is in turn covered with a transparent electrode layer 41, typically indium-tin oxide or tin oxide. Layer 41 would normally be covered by a transparent protective layer, not shown. In operation, an optical image of some writing, picture, etc. 43 is projected via a light source 42 and a lens system, not shown, onto the upper surface 41 of the sensor. The potential between the ITO layer 41 and the sources of the NVFETs in the array is held at a level sufficient to reposition the movable protons in the transistors. But only in those areas of the photoconductive layer 40 that are illuminated by the light will the potential be provided in close enough proximity to the gates of the transistors to cause repositioning of the protons. In the non-illuminated regions of the photoconductive layer 40, the underlying NVFETs will not have the protons in their oxide layers repositioned in response to the projected image.

Figure 5:
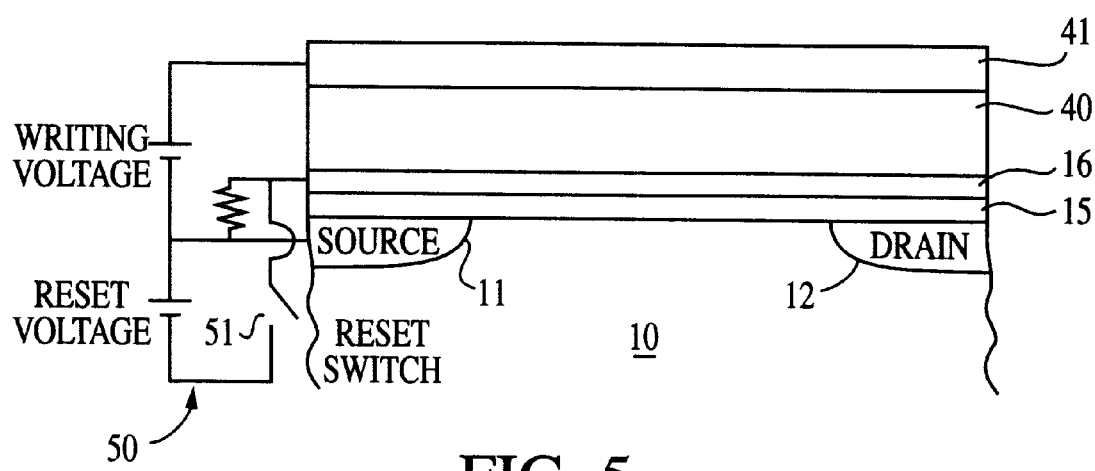
FIG. 5 is an expanded view showing the electrical connections to an individual NVFET in the array shown in FIG. 4.

The creation of the potential is facilitated by the electrical scheme shown in FIG. 5. Here one of the pixels in the array is shown with the transparent electrode 41, the photoconductive layer 40, the gate 16 of the NVFET, the oxide layer 15, and the substrate 10 with the source 11 and drain 12 regions therein. Connected to the transparent electrode 41, the gate 16 and the source 11 is the potential divider 50, as shown. In the absence of an illuminated portion of the image falling upon the photoconductor layer 40 above the gate 15, only a small potential is held between the gate and the source 11. This small voltage is not enough to reposition the protons in the oxide layer 15. When the photoconductor is illuminated, a conducting path is established between the transparent ITO electrode 41 and the gate 16 such that the full potential necessary to reposition the protons in the oxide layer 15 appears between the gate and source contacts. The mobile protons are then driven to the other side of the oxide layer, and the state of the NVFET is changed. When the light source is removed, the photoconductor layer 40 returns to a highly resistive state, and the protons remain in position. To reset the state of this pixel (and all the other pixels in the array that are similarly configured) the reset switch 51 is closed to drive the protons back to where they were before the illumination took place by means of the reset voltage as indicated.

One process sequence that has successfully produced functional NVFETs takes place substantially as follows. Other processes are possible and the invention herein is not limited to the preferred example.

The basic structure is that of a Si substrate that is covered by an embedded oxide that is covered by a monocrystalline or polycrystalline Sl surface layer. The embedded oxide is produced either by thermal oxidation of the substrate or an oxygen ion implant into the substrate. The structure is subjected to a high temperature anneal in an inert atmosphere containing a small quantity of oxygen ($N_2+1\%O_2$, $Ar+1\%$ $O_2$). The temperatures used may be up to 1320° C. for up to 6 hours.

The annealed wafer is then processed to define gate structures in the top Si film (photoresist+lithography+etching of Si+photoresist removal in a conventional manner).

The structure so formed is masked to define source and drain areas, and the exposed, embedded oxide is etched through to the substrate.

The source/drain/gate areas are now exposed (masking over the other areas), and implantations of n-type ions are carried out to heavily dope the source/drain/gate areas.

The masking photoresist is removed, and the activation anneal is carried out in an inert atmosphere, typically where T>850° C. for periods that depend on the dopant and the dopant activation dose.

Proton activation is carried out by annealing the device typically at 650° C. in an atmosphere containing $H_2$. A variant of this step is to perform a first anneal in the range of 500° C. to 800° C. in vacuum, then to perform the hydrogen anneal at around 650° C. in the $H_2$ containing atmosphere.

The annealed/activated sample is masked to leave Al contact points exposed. Al contacts are then formed on the source/drain and gate pads by deposition of Al. Prior to performing this step, an alternative can be to deposit a protective layer of $SiO_2$, $Si_3N_4$ or a polymer over the whole structure. This step should involve temperatures that are less than about 300° C. to avoid elimination of the protons.

Finally, the excess Al and photoresist are removed by an etching process which may involve a plasma or wet chemistry, as is generally practiced in this art. Above this layer are then placed the various insulating, photoconductive, or piezoelectric layers necessary to realize the various embodiments of the invention.

The operation of the invention and a preferred method of manufacture have been disclosed above. The true scope of the invention is to be found in the appended claims.

We claim:

1. An apparatus for sensing patterns of electric potential variations across a surface comprising:

a two-dimensional array of transistor structures formed on an insulating support, a transistor structure comprising source and drain regions with an intermediate channel region located in a first layer that is proximate to the insulating support layer, a second layer including a gate, and an intermediate layer between the first and second layers comprising a dielectric that contains mobile hydrogenous ions that move within the dielectric layer in response to electric potential in or proximate to the first and second layers; and a means to present the electric potential variations to the gates of the transistors in the array, the means to present the electric potential variations comprising a photoconductive layer above the second layer with a transparent electrode layer above the photoconductive layer and the apparatus additionally comprising means to create an electric potential sufficient to cause movement of the mobile hydrogenous ions with in the intermediate dielectric layer, said potential being placed between the transparent electrode layer and the sources of the transistors in the array.

2. An apparatus for sensing patterns of light intensity variations upon a surface comprising:

a two-dimensional array of transistor structures formed on an insulating support, a transistor structure comprising source and drain regions with an intermediate channel region located in a first layer that is proximate to the insulating support layer, a second layer including a gate, and an intermediate layer comprising a dielectric that contains mobile hydrogenous ions that move within the dielectric layer in response to electric potential in or proximate to the first and second layers;

a photoconductive layer above the second layer with a transparent electrode layer above the photoconductive layer, with the transparent electrode layer comprising the surface; and means to create an electric potential sufficient to cause movement of the mobile hydrogenous ions within the intermediate dialectic layer, said potential being placed between the transparent electrode layer and the sources of the transistors in the array, said photoconductive layer acting to present the sufficient potential only to those transistors below illuminated areas of the surface.

3. The apparatus of claim 2 wherein the means to create electric potential further includes means to reset the position of the hydrogenous ions to a common state.

* * * * *